United States Patent [19]

Fusegawa et al.

[11] Patent Number: 5,386,796
[45] Date of Patent: Feb. 7, 1995

[54] METHOD FOR TESTING QUALITY OF SILICON WAFER

[75] Inventors: Izumi Fusegawa; Hirotoshi Yamagishi; Nobuyoshi Fujimaki; Yukio Karasawa, all of Gunma, Japan

[73] Assignee: Shin-Etsu Handotai Co., Ltd., Tokyo, Japan

[21] Appl. No.: 850,916

[22] Filed: Mar. 13, 1992

[30] Foreign Application Priority Data

Mar. 14, 1991 [JP] Japan .................. 3-074733

[51] Int. Cl.$^6$ .............................................. C30B 15/00
[52] U.S. Cl. ........................................ 117/13; 117/14
[58] Field of Search ................ 156/601, 603, 617.1, 156/620.4, 620.7, 620.73, DIG. 64, DIG. 65, DIG. 111

[56] References Cited

U.S. PATENT DOCUMENTS 4,243,473  1/1981  Yamaguchi et al. ............... 156/626
4,276,114  6/1981  Takano et al. ............. 156/DIG. 66

FOREIGN PATENT DOCUMENTS 274832  1/1990  Germany .

OTHER PUBLICATIONS

Journal of the Electrochemical Society, vol. 119, No. 7, (Jul. 1972); pp. 948–951; "Dislocation Etch for (100) Planes in Silicon"; Aragona.
Japanese Journal of Applied Physics, vol. 20, No. 20-2, 1981, pp. 31–37; "Fabrication & Properties of Silicon Solar Cells Using Squarely Shaped Crystals"; Kuroda, et al.
Journal of Applied Physics, vol. 42, No. 11, (Oct. 1971), pp. 4262–4270; "Effect of Growth Parameters on the Residual Stress . . . ", Denicola.
IBM Technical Disclosure Bulletine, vol. 24, No. 18, (Jun. 1981), p. 508; "Crystal Revelation"; Cazcarra.
Applied Physics Letters, (May 1, 1979), pp. 611–613; "The Effect of Doping on Microdefect Formation . . . "; De Kock, et al.
"VLSI Fabrication Principles: Silicon & Gallium Arsenide"; Ghandhi; John Wiley & Sons, Inc., N.Y.; Chapter 9.4 (Cleaning); pp. 517–531 (1983).
"Chemical Etching of Silicon Wafer"; Hamaguchi *Journal of the Japan Society of Precision Engineering* (May); 1985; vol. 51, No. 5, pp. 1013–1018.

*Primary Examiner*—R. Bruce Breneman
*Assistant Examiner*—Felisa Garrett
*Attorney, Agent, or Firm*—Ronald R. Snider

[57] ABSTRACT

Quick and inexpensive determination of an aggregate of point defects in a grown silicon semiconductor single crystal bar is accomplished by a method which comprises cutting a wafer from a freshly grown silicon single crystal bar, etching the surface of this wafer with the mixture of hydrofluoric acid and nitric acid thereby relieving the wafer of strain, treating the wafer with the mixture of $K_2Cr_2O_7$, hydrofluoric acid, and water thereby giving rise to pits 2 and ripple patterns 1 therein, determining the density of the pits 2 and that of the ripple patterns 1, and rating the aggregate of point defects by virtue of the correlation between the densities of the pits 1 and the ripple patterns 1 and the aggregate of point defects.

2 Claims, 2 Drawing Sheets

# METHOD FOR TESTING QUALITY OF SILICON WAFER

BACKGROUND OF THE INVENTION

1. Field of the Invention

This invention relates to a method for testing the quality of a silicon wafer. More particularly, this invention relates to a method for testing a semiconductor silicon single crystal bar grown from molten silicon by the Czochralski (CZ) method or the float zone (FZ) method to determine the presence or absence therein of a D defect which is one form of the point defect.

2. Description of the Prior Art

As a measure to test the quality of a semiconductor silicon single crystal bar which has been grown by the Czochralski method or the float zone method, the procedure which comprises preparing a polished wafer (PW wafer) as a sample from the bar, oxidizing the surface of the silicon wafer with steam at a temperature in the range of from 1,100° C. to 1,200° C., cooling the oxidized silicon wafer to normal room temperature, stripping the oxidized silicon wafer of the oxide film with hydrofluoric acid, and selectively etching the wafer surface for about two minutes with a mixture of $K_2Cr_2O_7$, hydrofluoric acid, and water has been prevailing. This method represents a substantially perfect simulation of the heat treatment to be performed in the formation of a device on the silicon wafer. Because of its ability to determine the presence or absence of an oxidation-induced stacking fault within the wafer during the formation of the device, this method has been heretofore accepted as an important testing technique.

It has been known that an aggregate of point defects are introduced into a silicon single crystal bar while the growth thereof is in progress [(1) Takao Abe, "Applied Physics," 59 (1990), p. 272]. Among other defects, the A defect which is suspected to be an aggregate of interstitial silicon atoms and the D defect which is suspected to be an aggregate of vacancy type lattice defects are particularly popular. The aggregate of point defects is suspected to cause an oxidation-induced stacking fault (OSF) during the formation of the device. A need has been felt for a method capable of testing a silicon wafer to determine the presence or absence therein of the aggregate of point defects. The test of crystallinity which involves the heat treatment described above is problematic in that the test is impracticable unless the target of detection is an oxidation-induced stacking fault, that the test is incapable of directly detecting an aggregate of point defects to be formed during the growth of a crystal, that the test as a process spends a large amount of time, and that the apparatus required for the test is expensive. As a means of test for the detection of an aggregate of point defects, the copper decoration method has been adopted to date. This method comprises preparatorily applying an aqueous solution of nitric acid to the surface of a silicon wafer and then heating the coated silicon wafer at 1,000° C. for several hours thereby decorating an aggregate of point defects with copper.

The test by the copper decoration method mentioned above for the detection of an aggregate of point defects is problematic in that the test necessitates a heat treatment, that the treatment has the possibility of altering lattice defects themselves and, therefore, constitutes itself a destructive testing and consumes a long time, and that the apparatus required for the test is expensive.

SUMMARY OF THE INVENTION

This invention, conceived in the urge to solve the various problems of the prior art mentioned above, aims to provide a method for testing a wafer cut from a freshly grown silicon semiconductor single crystal and allowing quick and inexpensive detection of an aggregate of point defects.

The method of this invention for testing the quality of a silicon wafer is characterized by a procedure which comprises pulling a silicon semiconductor single crystal bar by the Czochralski method or the float zone method, cutting a wafer of a prescribed thickness from the single crystal bar, etching the surface of the wafer with a mixture of hydrofluoric acid and nitric acid thereby relieving the wafer of strain, then selectively etching the treated surface in a mixture of $K_2Cr_2O_7$ and hydrofluoric acid, taking count of scale-like patterns consequently exposed from the etched surface, and rating crystallinity of the wafer as to lattice defects.

DETAILED DESCRIPTION OF THE PREFERRED EMBODIMENT

In the method of this invention for testing a silicon wafer, the thickness of the silicon wafer is desired to be not less than 0.3 mm and not more than 2 mm and the ratio of hydrofluoric acid to nitric acid is desired to be approximately 1:3 to ensure smooth etching of the surface.

The selective etching of the wafer in the mixture of $K_2Cr_2O_7$, hydrofluoric acid, and water is desired to be effected by immersing wafer in the mixture at normal room temperature for a period of not less than 10 minutes and not more than 60 minutes.

As a concrete example of the mixture of $K_2Cr_2O_7$, hydrofluoric acid, and water, the SECCO solution [F. Secco D'Aragona: J. Electrochem. Soc., 119 (1972), 948] has been well known. It is prepared by mixing water having 0.15 mol of $K_2Cr_2O_7$ dissolved therein with 49% hydrofluoric acid in a volumetric ratio of 1:2. The SECCO solution has been heretofore used for selectively etching oxidation-induced stacking faults originating in the heat treatment thereby giving rise to a linear defect or for visualizing slip dislocations generated during the growth of an ingot. The use of this solution for visualization of scale-like patterns on a wafer as contemplated by this invention has never been known to the art.

Figure 1:
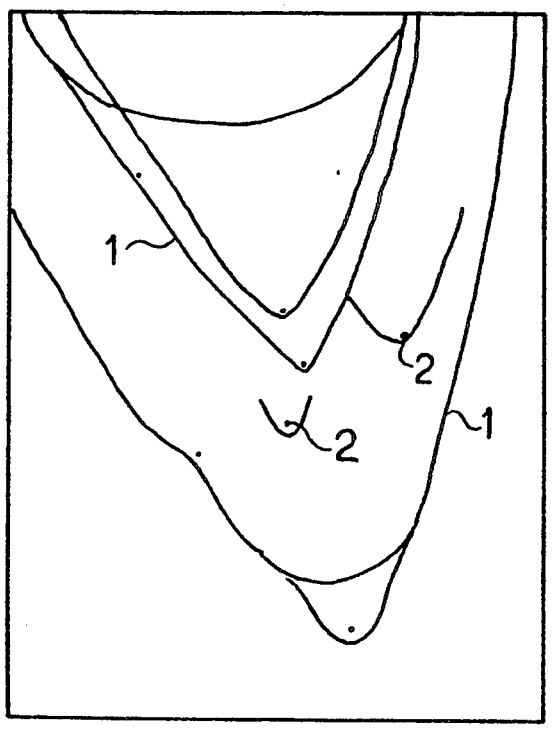
FIG. 1 is a sketch of scale-like patterns which appear on the surface of a silicon wafer after the silicon wafer has been given a mirror etching and then subjected to etching with the SECCO solution.

When a wafer cut out of an as-grown silicon semiconductor single crystal bar has the surface thereof subjected to mirror etching with the mixture of hydrofluoric acid and nitric acid and then has the mirror etched surface subjected to etching with the mixture of $K_2Cr_2O_7$, hydrofluoric acid, and water, small pits 2 appear one each at the leading ends of scale-like patterns 1 as illustrated in FIG. 1. The scale-like patterns occur because the gas such as hydrogen tends to be produced by a chemical reaction in the areas of such pits and the gas, while leaking upwardly from the etched surface, disrupt the evenness of etching. This inferrence is supported by the observation that these scale-like patterns are expanded upwardly in the vertical direction when the wafer is set upright in the solution. It is, therefore, logical to conclude that these scale-like patterns originate in a certain kind of crystal defect which is inherent in crystal.

In accordance with the procedure of testing described above, a silicon semiconductor single crystal bar liable to show a D defect and an A defect is grown. A silicon wafer is cut out of the resultant ingot. The strain layer on the surface of the silicon wafer is removed by etching with the mixture of hydrofluoric acid and nitric acid. Then, the scale-like patterns consequently appearing on the etched surface are treated with the mixture of $K_2Cr_2O_7$, hydrofluoric acid, and water to determine the difference in density of such scale-like patterns from one area to another on the surface of the wafer. From the resultant wafer, the $K_2Cr_2O_7$ layer consequently deposited on the surface is removed by etching. The denuded wafer is immersed in an aqueous 5% copper nitrate solution for five minutes, then treated in a furnace kept at 1,000° C. to effect copper decoration of defects, cooled to normal room temperature, and subjected to an X-ray topographic analysis. Then, a satisfactory correlation is found between the two sets of test results obtained above. Thus, the test for detection of an aggregate of point defects can be carried out without taking the trouble of preparing a polished wafer (PW wafer) and then processing this wafer for copper decoration.

The test for detection of an aggregate of point defects in a given semiconductor silicon single crystal bar can be attained by cutting a wafer from a freshly grown semiconductor silicon single crystal bar, removing a strain layer on the surface of this wafer by etching with the mixture of hydrofluoric acid and nitric acid, then treating the denuded surface of the wafer with the mixture of $K_2Cr_2O_7$, hydrofluoric acid, and water thereby giving rise to pits and scale-like patterns in the wafer, determining the density of these pits and that of the scale-like patterns, and utilizing the correlation between the densities of pits and scale-like patterns and the aggregate of point defects.

EXAMPLE

Now, this invention will be described more specifically below with reference to a working example.

A plurality of silicon semiconductor single crystal bar 130 mm in diameter were pulled by the CZ method and the FZ method.

In accordance with the CZ method, silicon placed in a quartz crucible 45 cm in diameter was doped with boron and adjusted so as to set the electric resistance at 10 ohm.cm. The single crystal bars thus grown were invariably pulled in the orientation of <100>. During the pulling of each semiconductor silicon single crystal bar by the CZ method, the speed of pulling was suddenly decreased from 1.3 mm/min. to 0.2 mm/min. and, after 5 cm of pull, it was increased to 1.3 mm/min. to insert a change in the manner of appearance of an aggregate of point defects. The fact that this measure gives rise to an aggregate of point defects in the silicon single crystal bar has already been reported to the art [Takao Abe, "Applied Physics," 59 (1990), p. 272].

In accordance with the FZ method, each silicon single crystal bar was grown at a fixed speed of pulling of 2.6 mm/min. in the orientation of <100> as doped with boron. It is known that in the silicon single crystal bar grown under these conditions of pulling, an aggregate of point defects appear in the produced bar [Takao Abe, "Applied Physics," 59 (1990), p. 272].

From the semiconductor silicon single crystal bar grown by the pulling described above, a sample silicon wafer 1 mm in thickness was sliced by the use of a diamond saw. This silicon wafer was subjected to mirror etching with the mixture of hydrofluoric acid and nitric acid mentioned above, thoroughly rinsed with purified water, and then subjected to selective etching of the surface with the SECCO solution for a period in the range of from one to 60 minutes. When the etching was continued for not less than 10 minutes, the wafer set upright in the solution was observed to form scale-like patterns expanding upwardly in the vertical direction as illustrated in FIG. 1. It was found that when this etching was continued for more than 60 minutes, the scale-like patterns overlapped so heavily as to Jeopardize the ease of determination of the density thereof. The overall distribution of scale-like patterns was attained by continuing the etching with the solution for 30 minutes, a conceivably ideal duration, and photographing the affected surface of the wafer under the condensed light from a halogen lamp. The density of the scale-like patterns in this case was determined by taking count of the scale-like patterns under an optical microscope. Further, the silicon wafer surface was again subjected to mirror etching with the aforementioned mixture of hydrofluoric acid and nitric acid, rinsed thoroughly with purified water to remove the $K_2Cr_2O_7$ adhering to the surface, kept immersed in an aqueous 5% copper nitrate solution for five minutes, treating the wet silicon wafer in a furnace kept at 1,000° C. to effect copper decoration, then cooled to normal room temperature, and subjected to an X-ray topographic analysis to locate the sites of an aggregate of point defects.

Figure 2A:
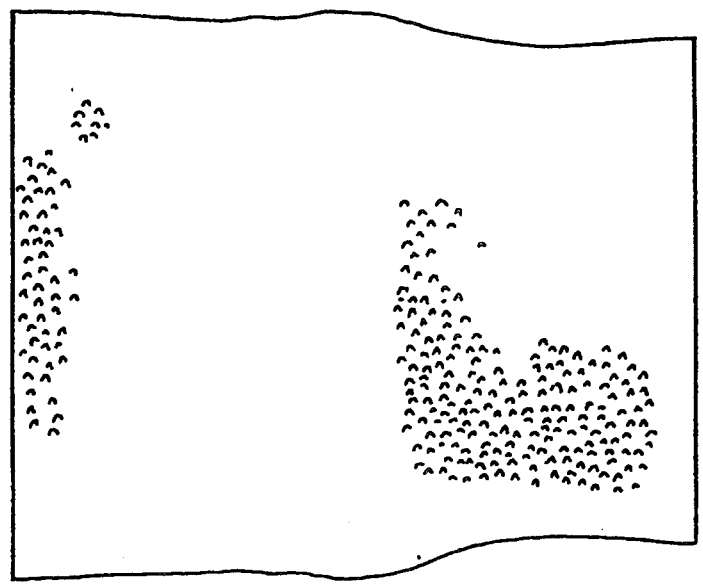
FIG. 2a shows the relation between the density of scale-like patterns (SECCO etch pit density) appearing on the surface of a silicon wafer cut longitudinally along the axis of growth of a CZ silicon bar grown with the speed of pulling suddenly decreased from 1.3 mm/min. to 0.2 mm/min. and then increased to 1.3 mm/min. in the course of growth after the wafer has been given a mirror etching and then subjected to etching with the SECCO solution and the speed of pulling of crystal
Figure 2B:
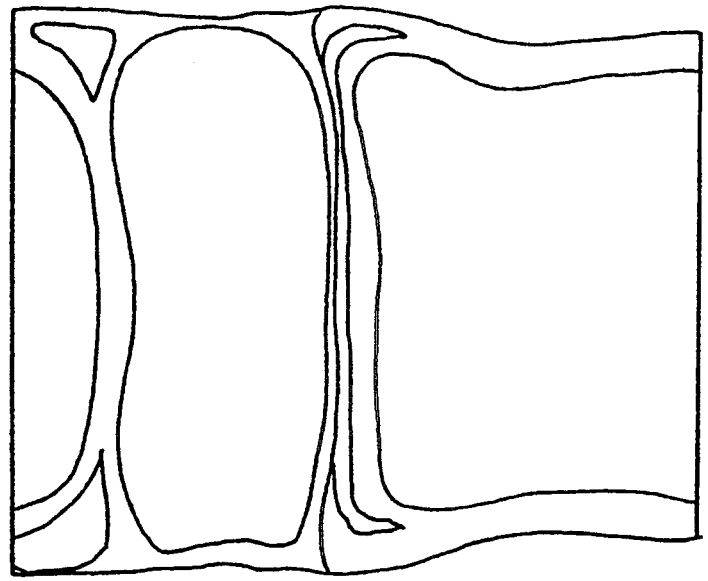
FIG. 2b is an X-ray topographic image of the etched surface of the silicon wafer of FIG. 2a which has been further subjected to etching of a $K_2Cr_2O_7$ coat thereof with a mixture of hydrofluoric acid and nitric acid so as to effect copper decoration.

The photograph of this CZ wafer taken after the etching thereof with the mixture of $K_2Cr_2O_7$, hydrofluoric acid, and water and the X-ray topographic image of the CZ wafer after the copper decoration are shown in FIG. 2b. It is clearly noted that in the area of a D defects on the X-ray topographic image, scale-like patterns were produced and could be discerned as D defects. The relation with the speed of crystal growth was as shown in FIG. 2a. In the diagram, the count of scale-like patterns is represented in terms of density. It is seen that the density of scale-like patterns which was 0/cm$^2$ at the speed of crystal growth of 0.2 mm/min. increased in proportion as the speed of crystal growth increased thence and reached about 3,000/cm$^2$ at the speed of crystal growth of 1.3 mm/min. These results indicate that the method of this invention is effective in testing the quality of a silicon wafer.

Even on the silicon wafers produced by the FZ method, this method succeeded in detecting such scale-like patterns. The surface density of these scale-like patterns was found to be 3,000/cm$^2$, a somewhat higher level than on the silicon wafers produced by the CZ method.

As is evident from the description given above, this invention attains detection of an aggregate of point defects not by preparing a polished wafer from by a silicon semiconductor single crystal bar grown from molten silicon by the Czochralski method or the float zone method and subjecting this polished wafer to copper decoration but by cutting a wafer of a prescribed thickness from the single crystal bar, etching the surface of the wafer with the mixture of hydrofluoric acid and nitric acid thereby relieving the wafer of strain, then etching the wafer with the mixture of $K_2Cr_2O_7$, hydrofluoric acid, and water for a stated period, and taking count of scale-like patterns appearing consequently on the etched surface.

This invention, therefore, allows quick and inexpensive determination of an aggregate of point defects in a given silicon semiconductor single crystal bar by using a wafer cut from the as-grown single crystal bar without requiring the labor otherwise involved in the preparation of a polished wafer, the time otherwise spent in the step of determination, or the expensive apparatus otherwise necessary for the determination.

What is claimed is:

1. A method for testing a silicon wafer, characterized by a procedure which comprises pulling a silicon semiconductor single crystal bar by the Czochralski method or the float zone method, cutting a wafer of a prescribed thickness from said single crystal bar, etching the surface of said wafer with a mixture of hydrofluoric acid and nitric acid thereby relieving said wafer of strain, selectively etching the surface of said wafer in a mixture of $K_2Cr_2O_7$, hydrofluoric acid, and water, and taking count of scale-like patterns consequently appearing on the surface thereby rating the crystallinity of said wafer with reference to lattice defects, wherein said scale-like patterns occur when gas produced by a chemical reaction in the areas of pits leaks upward and disrupts the evenness of the etching.

2. A method for testing a silicon wafer, characterized by a procedure which comprises pulling a silicon semiconductor single crystal bar by the Czochralski method of the froat zone method, cutting a wafer of a prescribed thickness from said single crystal bar, placing said wafer in a substantially upright position in an etching solution, etching the surface of said wafer with the mixture of hydrofluoric acid and nitric acid thereby relieving said wafer of strain, selectively etching the surface of said wafer in a mixture of $K_2Cr_2O_7$, hydrofluoric acid, and water, and taking count of scale-like patterns consequently appearing on the surface thereby rating the crystallinity of said wafer with reference to lattice defects, wherein said scale-like patterns occur when gas produced by a chemical reaction in the areas of pits leaks upward and disrupts the evenness of the etching.

* * * * *